US012444581B2

(12) United States Patent
Iwase et al.

(10) Patent No.: US 12,444,581 B2
(45) Date of Patent: Oct. 14, 2025

(54) PLASMA PROCESSING APPARATUS

(71) Applicant: HITACHI HIGH-TECH CORPORATION, Tokyo (JP)

(72) Inventors: Taku Iwase, Tokyo (JP); Masakazu Isozaki, Tokyo (JP); Kenetsu Yokogawa, Tokyo (JP); Masahito Mori, Tokyo (JP); Junichi Sayama, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/957,033

(22) PCT Filed: Jul. 29, 2019

(86) PCT No.: PCT/JP2019/029630

§ 371 (c)(1),
(2) Date: Jun. 22, 2020

(87) PCT Pub. No.: WO2020/121588

PCT Pub. Date: Jun. 18, 2020

(65) Prior Publication Data

US 2022/0157576 A1 May 19, 2022

(51) Int. Cl.
*H01L 21/306* (2006.01)
*H01J 37/32* (2006.01)

(52) U.S. Cl.
CPC .. *H01J 37/32669* (2013.01); *H01J 37/32183* (2013.01); *H01J 37/32513* (2013.01); *H01J 37/3266* (2013.01); *H01J 2237/334* (2013.01)

(58) Field of Classification Search
CPC ............. H01J 37/3266; H01J 37/32678; H01J 37/32688; H01J 37/32183;
(Continued)

(56) References Cited

U.S. PATENT DOCUMENTS 6,551,445 B1 * 4/2003 Yokogawa ........ H01J 37/32623 156/345.46
2002/0084034 A1 * 7/2002 Kofuji ............... H01J 37/32082 216/75

(Continued)

FOREIGN PATENT DOCUMENTS

JP 1041095 * 2/1998
JP 2004200429 A 7/2004

(Continued)

OTHER PUBLICATIONS

Search Report mailed Oct. 21, 2019 in correponding International Application No. PCT/JP2019/029630.

(Continued)

*Primary Examiner* — Luz L Alejandro Mulero
(74) *Attorney, Agent, or Firm* — Miles & Stockbridge, P.C.

(57) ABSTRACT

In order to be able to independently control a plasma density distribution both in a distribution with high center and a nodal distribution, and perform a plasma processing on a sample with higher accuracy for processing uniformity, a plasma processing apparatus includes: a vacuum vessel in which a plasma processing is performed on a sample; a radio frequency power source configured to supply radio frequency power for generating plasma; a sample stage on which the sample is placed; and a magnetic field forming unit configured to form a magnetic field inside the vacuum vessel and disposed outside the vacuum vessel, in which the magnetic field forming unit includes: a first coil; a second coil that is disposed closer to an inner side than the first coil and has a diameter smaller than a diameter of the first coil; a first yoke that covers the first coil, and an upper side and a side surface of the vacuum vessel, and in which the first coil is disposed; and a second yoke that covers the second
(Continued)

coil along a peripheral direction of the second coil and has an opening below the second coil.

9 Claims, 6 Drawing Sheets

(58) Field of Classification Search
CPC ........... H01J 37/32513; H01J 37/32082; H01J 37/32091; H01J 37/321; H01J 37/32174; H01J 37/32266
See application file for complete search history.

(56) References Cited

U.S. PATENT DOCUMENTS

| | | | | |
|---|---|---|---|---|
| 2002/0104482 | A1* | 8/2002 | Kazumi | H01J 37/32082 118/500 |
| 2005/0072444 | A1* | 4/2005 | Shirayone | H01L 21/32136 134/1 |
| 2006/0169410 | A1* | 8/2006 | Maeda | H01J 37/32935 156/345.28 |
| 2007/0044916 | A1* | 3/2007 | Isozaki | C23C 28/00 156/345.52 |
| 2007/0215580 | A1 | 9/2007 | Koshiishi et al. | |
| 2007/0267145 | A1* | 11/2007 | Kitada | H01L 21/68742 118/728 |
| 2008/0230518 | A1 | 9/2008 | Brillhart et al. | |
| 2013/0228550 | A1* | 9/2013 | Mori | H03H 7/40 216/61 |
| 2017/0018407 | A1 | 1/2017 | Kondo | |
| 2018/0068835 | A1* | 3/2018 | Satake | C23C 16/52 |
| 2019/0096639 | A1 | 3/2019 | Takahashi et al. | |
| 2019/0189396 | A1 | 6/2019 | Iwase et al. | |

FOREIGN PATENT DOCUMENTS

| | | | |
|---|---|---|---|
| JP | 2005150606 | A | 6/2005 |
| JP | 2007250838 | A | 9/2007 |
| JP | 2008166844 | A | 7/2008 |
| JP | 2008277773 | A | 11/2008 |
| JP | 2015201552 | A | 11/2015 |
| JP | 2019061848 | A | 4/2019 |
| JP | 2019109980 | A | 7/2019 |

OTHER PUBLICATIONS

Ken'etsu Yokogawa et al.; "Real Time Estimation and Control Oxide-etch Rate Distribution Using Plasma Emission Distribution Measurement"; Japanese Journal of Applied Physics; vol. 47; No. 8; 2008; pp. 6854-6857.

* cited by examiner

[FIG. 1]
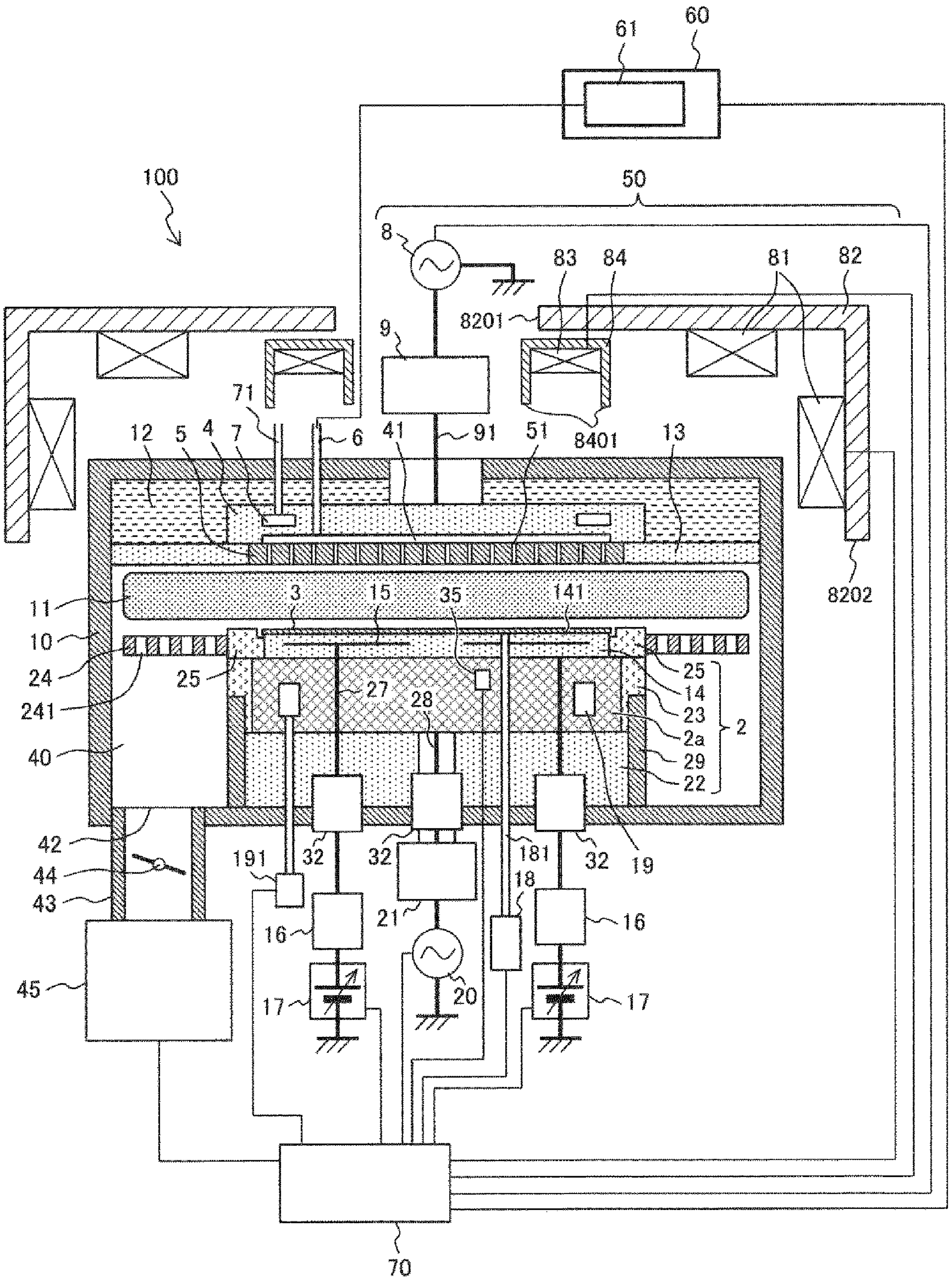

[FIG. 2]
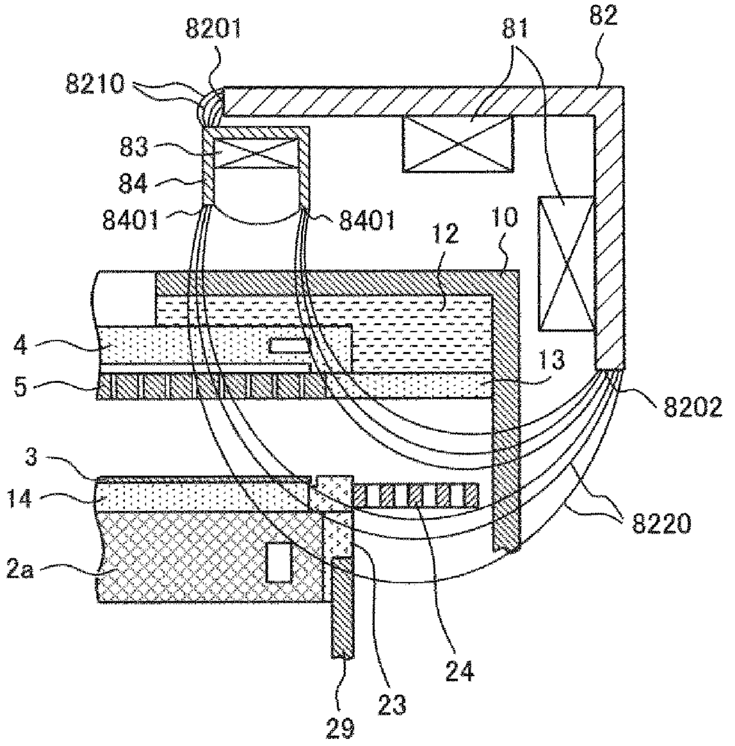
[FIG. 3]
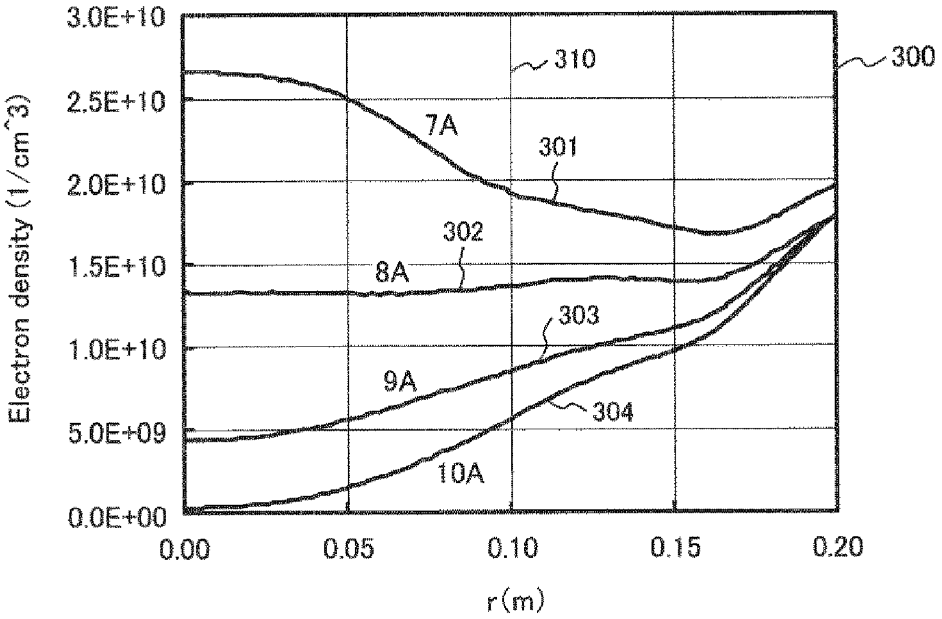

[FIG. 4]
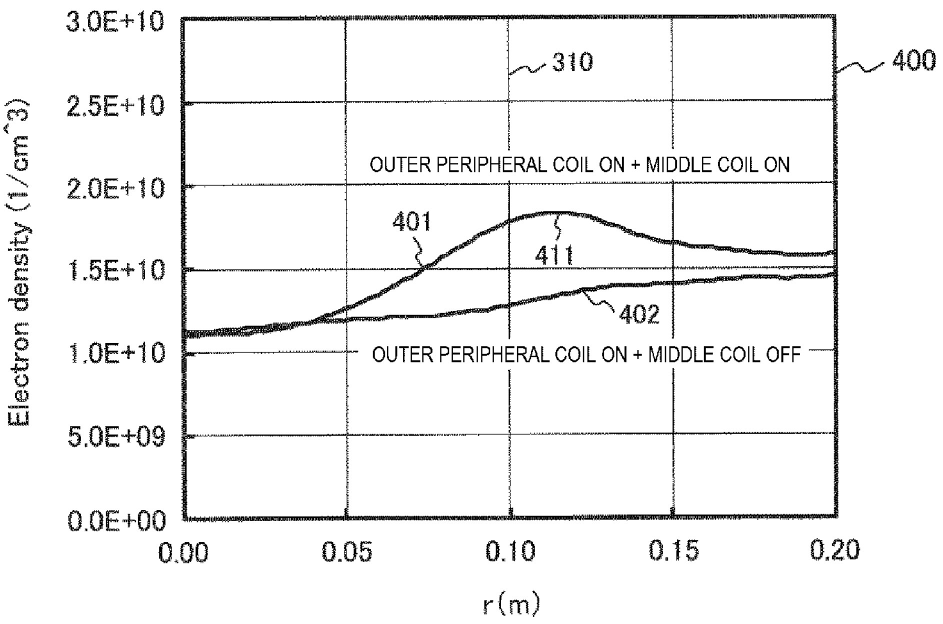
[FIG. 5]
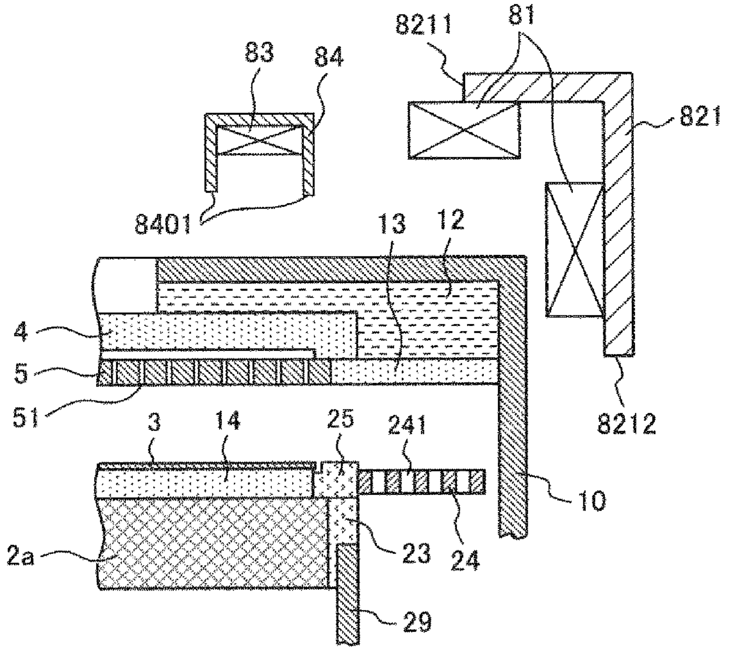

[FIG. 6]
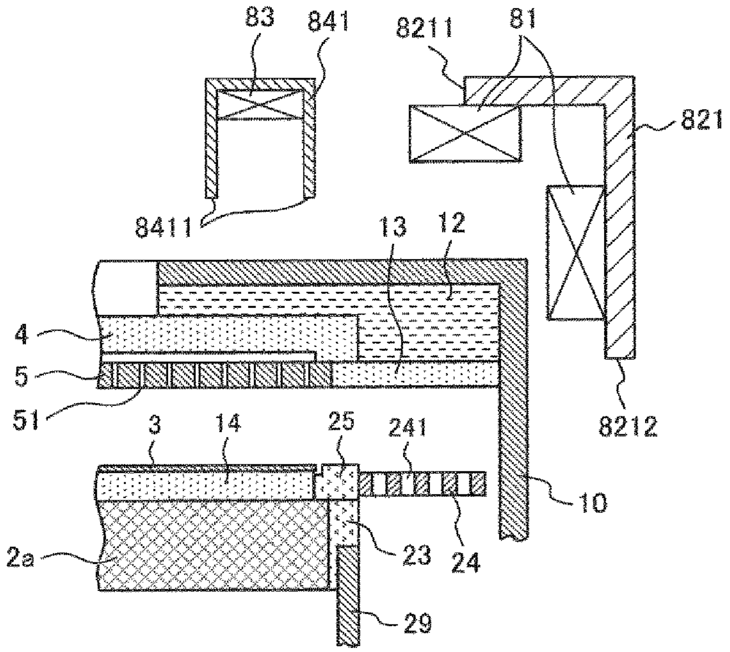
[FIG. 7]
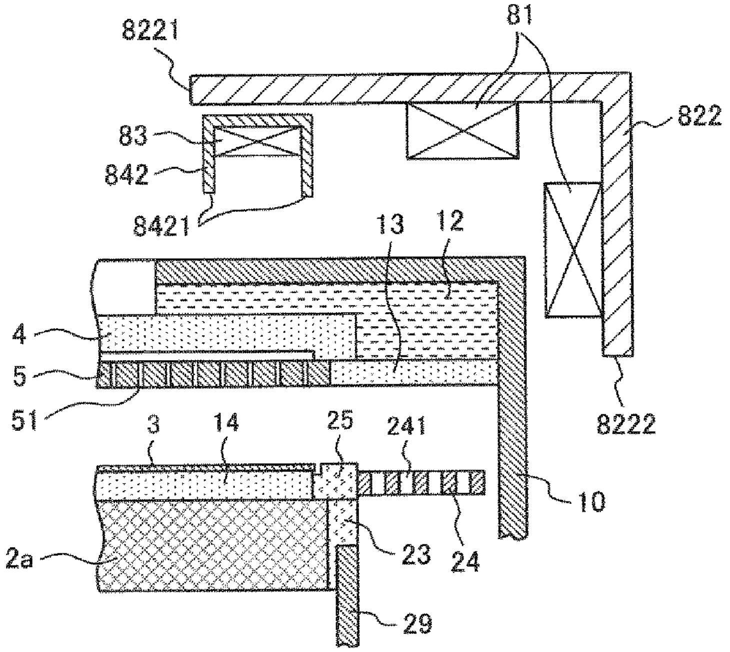

[FIG. 8]
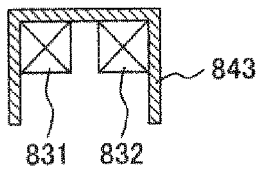
[FIG. 9]
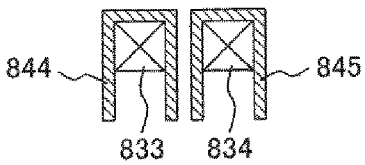

[FIG. 10]
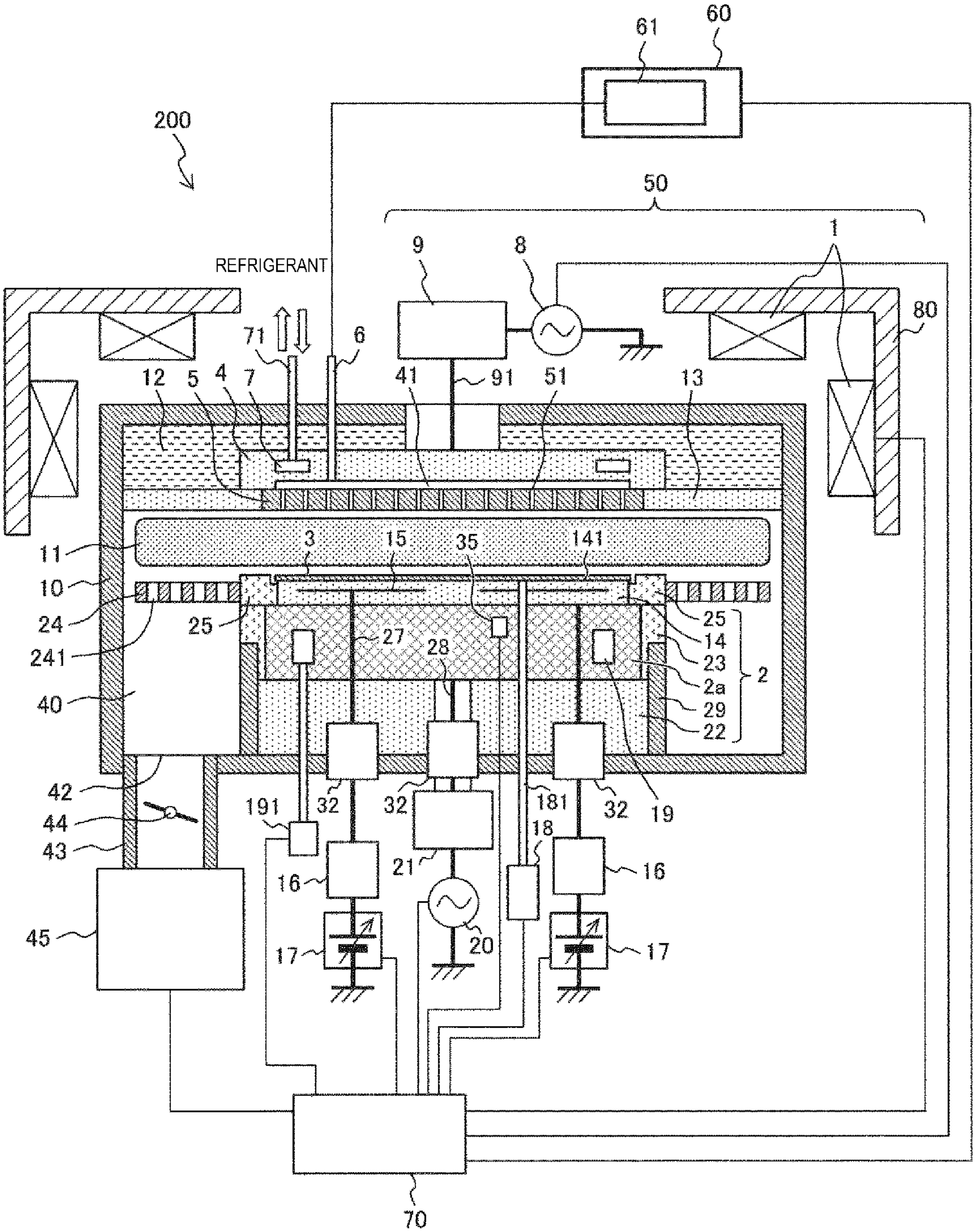

PLASMA PROCESSING APPARATUS

TECHNICAL FIELD

The present invention relates to a plasma processing apparatus suitable for performing a processing such as etching by using plasma on a material such as silicon oxide, silicon nitride, a low dielectric constant film, polysilicon, and aluminum in a manufacturing process of a semiconductor device.

BACKGROUND ART

In a manufacturing process of a semiconductor device, a plasma processing such as etching with low-temperature plasma is widely used. The low-temperature plasma can be formed, for example, by applying radio frequency power to a capacitively-coupled parallel plate electrode in which two electrodes, that is an upper electrode and a lower electrode, are disposed facing each other in a reaction vessel under reduced pressure. This parallel plate type plasma processing apparatus is frequently used in the manufacturing process of the semiconductor device.

In the parallel plate type plasma processing apparatus, a wafer made of, for example, a semiconductor material (hereinafter, referred to as a wafer) is placed between the two electrodes, plasma is generated by applying the radio frequency power to one electrode after introducing a desired process gas, and radicals and ions are supplied to the wafer, so as to perform the plasma processing. Such etching with the plasma can control anisotropy of a processing shape, and is therefore superior in processing accuracy.

A processing dimension of the semiconductor device is steadily miniaturized, and a demand for the processing accuracy is increasing. Therefore, it is required to generate low-pressure and high-density plasma while maintaining an appropriate gas dissociation state. A frequency of the radio frequency power applied to generate the plasma is generally 10 MHz or more, and a higher frequency is advantageous for generating the high-density plasma. However, when the frequency is increased, a wavelength of an electromagnetic wave is shortened, so that an electric field distribution in a plasma processing chamber is not uniform. The electric field distribution affects electron density of the plasma, and the electron density affects an etch rate. Since deterioration of an in-plane distribution of the etch rate lowers mass productivity, it is required to increase the frequency of the radio frequency power and improve the uniformity of the etch rate in a wafer surface.

Therefore, for example, PTL 1 (JP-A-2008-166844) discloses a technique in which a magnetic field diverging from a center of a wafer to an outer periphery is formed, and a plasma density distribution is made uniform by an interaction between the magnetic field and an electric field. Also, for example, PTL 2 (JP-A-2004-200429) discloses a technique in which a yoke is provided for each of a plurality of coils to locally control and uniform the plasma density distribution.

CITATION LIST

Patent Literature

PTL 1: JP-A-2008-166844
PTL 2: JP-A-2004-200429

SUMMARY OF INVENTION

Technical Problem

In a case of the plasma using radio frequency power in a VHF band or higher, although there are techniques (for example, PTL 1 and PTL 2) of controlling the distribution by an external magnetic field, it is difficult to concentrically control the overall plasma density distribution both unevenly and locally.

Therefore, the invention solves the problems of the related art, and provides a plasma processing apparatus capable of independently controlling a plasma density distribution both in a distribution with high center and a nodal distribution, and ensuring processing uniformity with higher accuracy when a plasma processing is performed on a sample.

Solution to Problem

In order to solve the above-described problems of the related art, in the invention, a plasma processing apparatus includes: a vacuum vessel in which a plasma processing is performed on a sample; a radio frequency power source configured to supply radio frequency power for generating plasma; a sample stage on which the sample is placed; and a magnetic field forming unit configured to form a magnetic field inside the vacuum vessel and disposed outside the vacuum vessel. The magnetic field forming unit includes: a first coil; a second coil that is disposed closer to an inner side than the first coil and has a diameter smaller than a diameter of the first coil; a first yoke that covers the first coil, and an upper side and a side surface of the vacuum vessel, and in which the first coil is disposed; and a second yoke that covers the second coil along a peripheral direction of the second coil and has an opening below the second coil.

Further, in order to solve the above-described problems of the related art, in the invention, a plasma processing apparatus includes: a vacuum vessel in which a plasma processing is performed on a sample; a radio frequency power source configured to supply radio frequency power for generating plasma; a sample stage on which the sample is placed; and a magnetic field forming unit configured to form a magnetic field inside the vacuum vessel and disposed outside the vacuum vessel. The magnetic field forming unit includes: a first coil; a second coil; a first yoke that covers the first coil and covers an upper side and a side surface of the vacuum vessel, and in which the first coil is disposed; and a second yoke that covers the second coil. The second coil and the second yoke are configured such that magnetic force lines emitted from one end portion of the first yoke return to the other end portion of the first yoke via the second yoke and magnetic force lines emitted from the second yoke return to the second yoke.

Advantageous Effect

According to the invention, a plasma density distribution can be independently controlled in both a distribution with high center and a nodal distribution, and processing uniformity can be ensured with higher accuracy when a plasma processing is performed on a sample placed on a sample stage.

BRIEF DESCRIPTION OF DRAWINGS

FIG. 1 is a block diagram showing a schematic configuration of a plasma processing apparatus according to an embodiment of the invention.

FIG. 2 is a partial cross-sectional view including an outer peripheral coil and a middle yoke and schematically showing a distribution state of magnetic force lines generated by the outer peripheral coil and the middle yoke in the plasma processing apparatus according to the embodiment of the invention.

FIG. 3 is a graph showing a coil current value dependence of an electron density distribution in a configuration shown in a comparative example.

FIG. 4 is a graph showing an electron density distribution according to ON/OFF of a middle coil current in the configuration shown in the embodiment of the invention.

FIG. 5 is a partial cross-sectional view showing a configuration of an outer peripheral coil, a middle yoke, and peripheral portions thereof according to a first modification of the invention.

FIG. 6 is a partial cross-sectional view showing a configuration of an outer peripheral coil, a middle yoke, and peripheral portions thereof according to a second modification of the invention.

FIG. 7 is a partial cross-sectional view showing a configuration of an outer peripheral coil, a middle yoke, and peripheral portions thereof according to a third modification of the invention.

FIG. 8 is a partial cross-sectional view showing a configuration of a middle yoke and a middle coil according to a fourth modification of the invention.

FIG. 9 is a partial cross-sectional view showing a configuration of a middle yoke and a middle coil in a fifth modification of the invention.

FIG. 10 is a block diagram showing a schematic configuration of a plasma processing apparatus exemplified as a comparative example of the embodiment of the invention.

DESCRIPTION OF EMBODIMENTS

The invention provides a plasma processing apparatus, in which (a) a variable divergent magnetic field is formed such that magnetic flux density (Br) in a radial direction of a plasma generation region becomes larger toward an outer periphery, and (b) the Br is variable only in the plasma generation region in a middle region (R=50 to 100 [mm]) of a wafer.

For (a), a yoke A with an L-shaped cross section is disposed above the plasma generation region to generate a path where a magnetic flux returns from a center to an outer peripheral side, and for (b), a U-shaped yoke B which opens downward is disposed right above the middle region of the wafer, and a coil C is disposed therein.

In order to return the magnetic flux emitted from an in-side end portion of the yoke A to an out-side end portion of the yoke A via the yoke B and return the magnetic flux emitted from an end portion of the yoke B to the yoke B, the yoke A is disposed above the yoke B and on an outer periphery of the yoke B.

Requirements at this time are that:

the cross section of the yoke A is L-shaped at a position that covers a chamber;

the yoke B is disposed above the plasma generation region and has a U shaped and opens downward;

the yoke A and the yoke B are spatially separated;

a center of gravity of the yoke B in a radial direction is on an inner peripheral side than that of the yoke A;

the center of gravity of the yoke B in the radial direction is on the wafer;

one or more coils are disposed inside the yoke B; and one or more coils are disposed adjacent to the inside of the yoke A, and for the coil C, a plurality of coils disposed side by side may be included. A radial position where electron density of plasma increases can be changed depending on any one of the plurality of coils in which a current flows.

It is desirable that a center position of the U-shaped yoke B in the radial direction is disposed at R=50 to 100 [mm]. More desirably, when a wavelength of radio frequency power is λ and a relative permittivity of a shower plate is ε, R=λ/≥/4*1000 [mm]. This is because a standing wave is likely to be generated at half an effective wavelength of a radio frequency propagating in a dielectric.

That is, in the invention, the variable divergent magnetic field is formed such that the magnetic flux density (Br) in the radial direction of the plasma generation region becomes larger toward the outer periphery, and the Br is variable only in the plasma generation region in the middle region (R=50 to 100 [mm]) of the wafer. The yoke A having the L-shaped cross section is disposed above the plasma generation region to generate the path where the magnetic flux returns from the center to the outer peripheral side, and the U-shaped yoke B which opens downward is disposed right above the middle region of the wafer, and a coil C is disposed therein. In order to return the magnetic flux emitted from the in-side end portion of the yoke A to the out-side end portion of the yoke A via the yoke B and return the magnetic flux emitted from the end portion of the yoke B to the yoke B, the yoke A is disposed above the yoke B and on the outer periphery.

Hereinafter, embodiments of the invention will be described in detail with reference to the drawings. In all the drawings for describing the present embodiment, components having the same function are denoted by the same reference numerals, and the repetitive description thereof will be omitted in principle.

However, the invention should not be construed as being limited to description of the embodiments described below. Those skilled in the art could have easily understood that specific configurations can be changed without departing from the spirit or gist of the invention.

First Embodiment

FIG. 1 is a longitudinal cross-sectional view schematically showing a configuration of a plasma processing apparatus 100 according to an embodiment of the invention.

The plasma processing apparatus 100 according to FIG. 1 is a magnetic field parallel plate type plasma processing apparatus using outer peripheral coils 81 and a middle coil which are solenoid coils. The plasma processing apparatus 100 of the present embodiment includes a vacuum vessel 10. A processing chamber 40 is formed, which is a space inside the vacuum vessel 10, and in which a sample to be processed is placed and to which a processing gas is supplied to form plasma.

Further, the plasma processing apparatus 100 includes: a plasma forming unit 50 that is disposed above the vacuum vessel 10 and is a unit configured to generate an electric field or a magnetic field for forming the plasma inside the processing chamber 40; an evacuation unit 45 that is connected to a lower portion of the vacuum vessel 10 and includes a vacuum pump such as a turbo molecular pump for reducing pressure by evacuating the inside of the processing chamber 40; and a control device 70 that controls the entire plasma processing apparatus 100.

Inside the processing chamber 40 of the vacuum vessel 10, a cylindrical sample stage 2 is disposed on a lower side thereof, and a placement surface 141 on which a substrate-shaped sample 3 to be processed (hereinafter, referred to as a sample 3) such as a semiconductor wafer is placed is formed on an upper surface of the sample stage 2.

Above the placement surface 141, a disc-shaped upper electrode 4 is provided, which is disposed to face the placement surface 141 and is supplied with radio frequency power for forming the plasma. Further, a disc-shaped shower plate 5, which includes a plurality of through holes 51 for dispersing and supplying a gas into the processing chamber 40, is disposed to face the placement surface 141 of the sample stage 2 on a sample 3 side of the upper electrode 4, and forms a ceiling surface of the processing chamber 40.

A gap 41 is formed between the shower plate 5 and the upper electrode 4 that is an antenna disposed above the shower plate 5, with the shower plate 5 and the upper electrode 4 in a state of being attached to the vacuum vessel 10. The gas is introduced into the gap 41 from a gas introduction line 6 connected to a gas supply unit 60, which is connected to the gap 41 and outside the vacuum vessel 10, via a gas flow path provided inside the upper electrode 4.

The gas supply unit 60 includes a plurality of mass flow controllers 61 corresponding to the type of a gas to be supplied, and each of the mass flow controllers 61 is connected to a gas cylinder (not shown). The gas supplied to the gap 41 is dispersed inside the gap 41, and is then supplied into the processing chamber 40 through the plurality of through holes 51 disposed in a region including a central portion on a shower plate 5 side.

The gas supplied from the gas supply unit 60 into the processing chamber 40 through the plurality of through holes 51 includes, for example, an inert gas that dilutes the processing gas used for processing the sample 3 or the processing gas not directly used for processing, or that is supplied into the processing chamber 40 to replace the processing gas when the processing gas is not supplied.

A refrigerant flow path 7 for upper electrode is formed inside the upper electrode 4. The refrigerant flow path 7 for upper electrode is connected to a refrigerant supply line 71 that is connected to a temperature control device (not shown) such as a chiller for adjusting a temperature of a refrigerant to a predetermined range. The refrigerant whose temperature is adjusted to the predetermined range by the temperature control device (not shown) is supplied into and circulated in the refrigerant flow path 7 for upper electrode via the refrigerant supply line 71, so that heat is exchanged and a temperature of the upper electrode 4 is adjusted to a range of values suitable for the processing.

Further, the upper electrode 4 is formed of a disc-shaped member made of aluminum or stainless steel, which is a conductive material, and a coaxial cable 91 to which the radio frequency power for plasma formation is transmitted is electrically connected to a central portion on an upper surface of the upper electrode 4.

The radio frequency power for plasma formation is supplied, via a radio frequency power matching unit 9 for discharge, to the upper electrode 4 from a radio frequency power source 8 for discharge (hereinafter, referred to as radio frequency power source 8) that is electrically connected to the upper electrode 4 via the coaxial cable 91, and an electric field is released from a surface of the upper electrode 4, through the shower plate 5, into the processing chamber 40. In the present embodiment, power of 200 MHz, which is a frequency in an ultra-high frequency band (VHF band), is used as the radio frequency power for plasma formation which is applied to the upper electrode 4 from the radio frequency power source 8.

Further, outside the vacuum vessel 10, at a position surrounding an upper portion of the processing chamber 40 from an upper side and a lateral side, the outer peripheral coils 81, which are electromagnetic coils covered by an outer peripheral yoke 82, and the middle coil 83, which is an electromagnetic coil covered by a middle yoke 84, are disposed. A magnetic field generated by the outer peripheral coils 81 and the middle coil 83 is formed inside the processing chamber 40.

The shower plate 5 is made of a dielectric such as quartz or a semiconductor such as silicon. Accordingly, in a state where the radio frequency power for plasma formation is applied from the radio frequency power source 8 to the upper electrode 4, the electric field formed by the upper electrode 4 can be transmitted through the shower plate 5.

Further, the upper electrode 4 is electrically insulated from the vacuum vessel 10 by a ring-shaped upper electrode insulator 12, which is made of a dielectric such as quartz or Teflon (registered trademark) and is disposed on an upper side and lateral sides of the upper electrode 4. Similarly, an insulation ring 13 made of a dielectric such as quartz is disposed around the shower plate 5, and the shower plate 5 is insulated from the vacuum vessel 10. The upper electrode insulator 12, the insulation ring 13, the upper electrode 4, and the shower plate 5 are fixed to a lid member (not shown) constituting an upper portion of the vacuum vessel 10, and revolve integrally with the lid member during operations of opening and closing the lid member.

A sidewall of the vacuum vessel 10 having a cylindrical shape is connected to a transfer vessel (not shown) that is a vacuum vessel and configured to transfer the sample 3 under reduced pressure. A gate is disposed between the sidewall and the transfer vessel, which works as an opening of a path through which the sample 3 is taken in and out. A gate valve which hermetically seals the inside of the vacuum vessel 10 by closing the gate when the sample 3 is processed inside the vacuum vessel 10 is disposed.

An evacuation opening 42 in communication with the evacuation unit 45 that evacuates the inside of the processing chamber 40 is disposed below the sample stage 2 inside the processing chamber 40 and on the lower portion of the vacuum vessel 10. A pressure adjustment valve 44, which is a plate-shaped valve, is disposed inside an evacuation path 43 that is disposed between the evacuation opening 42 and a vacuum pump (not shown) of the evacuation unit 45 and connects the evacuation opening 42 and the vacuum pump. The pressure adjustment valve 44 is a plate-shaped valve disposed across a cross section of the evacuation path 43, and the plate-shaped valve rotates around an axis to increase or decrease a cross-sectional area of the flow path.

The control device 70 adjusts an angle of rotation of the pressure adjustment valve 44, so that a flow rate or speed of an evacuated gas from the processing chamber 40 can be increased or decreased. A pressure inside the processing chamber 40 is adjusted by the control device 70 so as to be within a desired range by a balance between a flow rate or speed of a gas supplied from the through holes 51 of the shower plate 5 and a flow rate or speed of a gas or particles evacuated from the evacuation opening 42 to an evacuation unit 45 side.

Next, a structure around the sample stage 2 will be described. The sample stage 2 of the present embodiment is a cylindrical stage disposed in a central portion on a lower side of the processing chamber 40, and includes a metallic base member **2*a*** having a cylindrical shape or a disc shape.

The base member **2*a* of the present embodiment is electrically connected to a radio frequency power source 20** for bias by a power supply path 28 including a coaxial cable, via a radio frequency power matching unit 21 for bias disposed on the power supply path 28. A radio frequency power for bias applied to the base member 2*a* from the radio frequency power source 20 for bias has a frequency (4 MHz in the present embodiment) different from that of the radio frequency power for plasma formation applied to the upper electrode 4 from the radio frequency power source 8. Further, an element 32 such as a resistor or a coil is disposed on the power supply path 28, and the element 32 is connected to the radio frequency power matching unit 21 for bias and the radio frequency power source 20 for bias that are grounded.

When the radio frequency power for plasma formation is applied from the radio frequency power source 8 to the upper electrode 4 and plasma 11 is generated between the sample stage 2 and the shower plate 5, a bias potential is generated in the base member 2*a* by supplying the radio frequency power from the radio frequency power source 20 for bias to the base member 2*a*. Due to the bias potential, charged particles such as ions in the plasma 11 are attracted to an upper surface of the sample 3 or the placement surface 141. That is, the base member 2*a* functions as a lower electrode, to which the radio frequency power for bias is applied, below the upper electrode 4.

Further, inside the base member 2*a*, a refrigerant flow path 19 is arranged in a multiple concentric or spiral shape for circulating and flowing the refrigerant that is adjusted to a predetermined temperature by a temperature control device 191 such as a chiller.

On an upper surface of the base member 2*a*, an electrostatic attraction film 14 is disposed. The electrostatic attraction film 14 is made of a dielectric material such as alumina or yttria, and a tungsten electrode 15, to which direct current power for electrostatically attracting the sample 3 is supplied, is incorporated inside the electrostatic attraction film 14. A power supply path 27 for electrostatic attraction that penetrates the base member 2*a* is connected to a back surface of the tungsten electrode 15. The tungsten electrode 15 is electrically connected to a direct current power source 17 via the element 32 such as a resistor or a coil and via a low pass filter 16 that is grounded, by the power supply path 27 for electrostatic attraction.

A terminal on one end side of the direct current power source 17 and a terminal on one end side of the radio frequency power source 20 for bias of the present embodiment are grounded or electrically connected to the ground.

The low pass filter 16, which blocks and filters a flow of a current in a higher frequency, and the radio frequency power matching unit 21 for bias are disposed in order to prevent the radio frequency power for plasma formation from the radio frequency power source 8 from flowing into the direct current power source 17 and the radio frequency power source 20 for bias.

Direct current power from the direct current power source 17 and the radio frequency power from the radio frequency power source 20 for bias are supplied to the electrostatic attraction film 14 and the sample stage 2 respectively without loss, and the radio frequency power for plasma formation flowing from a sample stage 2 side into the direct current power source 17 and the radio frequency power source 20 for bias is supplied to the ground via the low pass filter 16 or the radio frequency power matching unit 21 for bias. Although the low pass filter 16 is not shown on the power supply path 28 from the radio frequency power source 20 for bias in FIG. 1, a circuit with similar effects as that of the low pass filter 16 is incorporated in the radio frequency power matching unit 21 for bias shown in the figure.

In such a configuration, impedance of power from the radio frequency power source 8 is relatively low when the direct current power source 17 and the radio frequency power source 20 for bias side are viewed from the sample stage 2. In the present embodiment, the element 32 such as a resistor or a coil for increasing the impedance is inserted between an electrode and the low pass filter 16 and between the electrode and the radio frequency power matching unit 21 for bias on the power supply path, so that the impedance of the radio frequency power for plasma formation is high (100Ω or more in the present embodiment) when the direct current power source 17 or the radio frequency power source 20 for bias side is viewed from the base member 2*a* side of the sample stage 2.

In the embodiment shown in FIG. 1, a plurality of the tungsten electrodes 15 are disposed inside the electrostatic attraction film 14, and bipolar electrostatic attraction, to which a direct current voltage is supplied, is performed such that one of the tungsten electrodes 15 has a polarity different from that of another tungsten electrode 15. Therefore, the electrostatic attraction film 14 forming the placement surface 141 is divided into two regions where the tungsten electrodes 15 have different polarities, at a value in a range that an area of a surface in contact with the sample 3 is equally divided into two parts or in a range approximate, and direct current power having independent values is supplied to the two regions respectively and voltages having different values are maintained.

A helium gas is supplied from a helium supply unit 18, via a pipe 181, to a space between the electrostatic attraction film 14 and a back surface of the sample 3 that are in contact with each other due to electrostatic attraction. Accordingly, an efficiency of heat transfer between the sample 3 and the electrostatic attraction film is improved, an exchange amount of heat with the refrigerant flow path 19 inside the base member 2*a* can be increased, and an efficiency of adjusting a temperature of the sample 3 is improved.

A disc-shaped insulation plate 22, made of Teflon (registered trademark) or the like, is disposed below the base member 2*a*. Accordingly, the base member 2*a*, which is set to a ground potential by being grounded or being electrically connected to the ground, is electrically insulated from a lower member constituting the processing chamber 40. Further, a ring-shaped insulation layer 23 made of a dielectric material such as alumina is disposed around side surfaces of the base member 2*a* so as to surround the base member 2*a*.

A conductive plate 29 made of a conductive material, which is set to the ground potential by being grounded or being electrically connected to the ground, is disposed around the insulation plate 22 and the insulation layer 23. The insulation plate 22 is disposed below the base member 2*a* and is connected to the base member 2*a*, and the insulation layer 23 is disposed on the insulation plate 22 to surround the base member 2*a*. The conductive plate 29 is a plate member having a circular shape or an approximate shape when viewed from above. The insulation layer 23 is interposed between the conductive plate 29 and the base member 2*a*, and thus the conductive plate 29 and the base member 2*a* are electrically insulated from each other.

A susceptor ring 25 made of a dielectric such as quartz or a semiconductor such as silicon is disposed above the ring-shaped insulation layer 23. The susceptor ring 25 is disposed around the sample 3 and the base member 2*a* is covered by the susceptor ring 25 and the insulation layer 23, so that a distribution of reaction products around an outer end portion of the sample 3 is controlled and a uniform processing performance is realized.

Thus, the sample stage 2 includes: the base member 2*a*; the electrostatic attraction film 14 with the tungsten electrode 15 therein; the insulation plate 22 on which the base member 2*a* is placed and which electrically insulates the base member 2*a* from the vacuum vessel 10; the insulation layer 23 which is made of an insulation material and surrounds the base member 2*a*; the susceptor ring 25 which covers the upper surface of the base member 2*a* and side surfaces of the electrostatic attraction film 14; and the conductive plate 29 which covers an outer peripheral portion of the insulation plate 22 and an outer peripheral portion of the insulation layer 23.

A shield plate 24 in a concentric and plate shape is disposed on an outer peripheral side of the susceptor ring 25 so as to be in contact with the susceptor ring 25. The shield plate 24 is disposed to prevent a generation region of the plasma 11 formed inside the processing chamber 40 from expanding to a side surface of the sample stage 2 and bias the same toward an upper portion of the sample stage 2, that is, to confine the generation region of the plasma 11. A plurality of holes 241 are formed in the plate-shaped shield plate 24 in order to allow gas and particles to pass therethrough in an up-down direction.

A temperature measurement device 35 embedded in the base member 2*a* measures a temperature of the base member 2*a*. In a state where another temperature measurement device (not shown) is disposed on a surface of the sample 3, the sample 3 is heated by a heating unit (not shown) to change the temperature of the sample 3, a database is created in advance for indicating a relationship between a surface temperature of the sample 3 measured at this time by the temperature measurement device (not shown) and the temperature of the base member 2*a* measured by the temperature measurement device 35 embedded in the base member 2*a*, and the database is stored. When the plasma 11 is generated and the sample 3 is actually processed inside the processing chamber 40, by referring to the database, the temperature of the sample 3 during the plasma processing can be estimated based on the temperature of the base member 2*a* measured by the temperature measurement device 35 embedded in the base member 2*a*.

In the plasma processing apparatus 100 according to the present embodiment, the outer peripheral yoke 82 having an L-shaped cross section is disposed in the vicinity the outer peripheral coils 81 so as to surround the outer peripheral coils 81. The middle coil 83 and the middle yoke 84 having a U-shaped cross section so as to surround the middle coil 83 are disposed on an inner side of the outer peripheral yoke 82. The outer peripheral yoke 82 having the L-shaped cross section and the middle yoke 84 having the U-shaped cross section are disposed so as not to be in contact with each other.

The middle yoke 84 has a U shape and opens downward such that when power is applied to the middle coil 83 to generate a magnetic field, the magnetic flux generated from the middle yoke 84 diverges to the region generation of the plasma 11 above the sample 3 placed on the sample stage 2.

Shapes and arrangements of the outer peripheral coils 81, the outer peripheral yoke 82, the middle coil 83, the middle yoke 84 are determined in order to form an variable divergent magnetic field such that the magnetic flux density (Br) in a radial direction of the generation region of the plasma 11 above the sample 3 placed on the sample stage 2 becomes larger toward an outer periphery, and to vary the Br of the plasma generation region in a middle region (for example, when the sample 3 is a wafer having a diameter of Φ300 mm, R=50 to 100 [mm]) of the sample 3.

In a configuration of the present embodiment, the outer peripheral yoke 82 partially overlaps above the middle yoke 84 and is disposed on the outer periphery thereof. With such a configuration, as schematically shown in FIG. 2, due to a magnetic field generated by flowing a current through the outer peripheral coils 81, a magnetic flux represented by magnetic force lines 8210 that is emitted from an in-side end portion 8201 of the outer peripheral yoke 82 can be returned to an out-side end portion 8202 of the outer peripheral yoke 82 via the middle yoke 84. Further, due to a magnetic field generated by flowing a current through the middle coil 83, a magnetic flux represented by magnetic force lines 8220 that is emitted from an end portion 8401 of the middle yoke 84 can be returned to the middle yoke 84 via the outer peripheral yoke 82. In FIG. 2, the magnetic fluxes represented by the magnetic force lines 8210 and 8220 indicate a state of the magnetic flux generated when a current flows through the outer peripheral coils 81 and the middle coil 83 at the same time.

Accordingly, a magnetic field formed by the outer peripheral yoke 82 having the L-shaped cross section and the middle yoke 84 having the U-shaped cross section forms a magnetic flux that diverges smoothly from a center toward an outer periphery, and unevenness (shading) of an electron density distribution of the plasma (hereinafter, also simply referred to as a plasma density distribution) can be controlled. Further, since the U-shaped middle yoke 84 is spatially separated from the outer peripheral yoke 82 having the L-shaped cross section, the middle yoke 84 can form a relatively independent magnetic flux loop with respect to the outer peripheral yoke 82, and as shown in FIG. 4, the plasma density distribution in the middle region can be controlled.

As a result, the magnetic field can be controlled relatively accurately in the generation region of the plasma above the sample stage 2, and an electron density distribution in the vicinity of the sample 3 placed on the sample stage 2 can be controlled relatively accurately.

Next, a comparative example will be described. FIG. shows a plasma processing apparatus 200 as the comparative example with respect to the embodiment of the invention. In an overall configuration of the plasma processing apparatus 200 of the comparative example, parts similar to those of the plasma processing apparatus 100 described in the embodiment described with reference to FIG. are denoted by the same reference numerals, and the description will not be repeated. The plasma processing apparatus 200 shown in FIG. 10 is different from the embodiment described with reference to FIG. 1 in that the middle coil 83 and the middle yoke 84 are not included as configurations of a yoke and a coil.

A structure of a yoke 80 of the comparative example shown in FIG. 10 has an L-shaped cross section, and coils 1 are disposed inside the yoke 80 at two places on an inner side and an outer side. The structure is similar to configurations of a yoke 5 and a coil 6 in a plasma processing apparatus described in PTL 1.

When the configurations of the yoke 80 and the coils 1 are configured as shown in the comparative example of FIG. 10, a static magnetic field formed by the coils 1 and the yoke 80 forms a magnetic circuit connecting an inner end portion and an outer end portion of the yoke 80. This static magnetic field forms a hanging magnetic field in which the magnetic flux diverges toward an outer periphery.

FIG. 3 shows a result of calculating the electron density distribution of the plasma in the configuration of the comparative example of the invention shown in FIG. 10. Each calculation is performed by changing a current value of each of the coils 1 from 7 A to 10 A. In FIG. 3, reference numerals 301 to 304 denote the electron density distributions of the plasma in a radial direction of the sample stage 2 when the current values of the coils 1 are 7 A, 8 A, 9 A, and 10 A, respectively. It is understood that an electron density distribution having no high inner periphery such as the electron density distribution 301 and an electron density distribution having a high outer periphery such as the electron density distribution 304 can be formed by the current values of the coils 1. However, as shown by the electron density distributions 301 to 304, the electron density around a radius of 100 mm indicated by a radial position 310 does not locally increase at any current value.

On the other hand, FIG. 4 shows a result of calculating an electron density distribution of the plasma in the configuration of the embodiment of the invention shown in FIG. 1. In the configuration shown in FIG. 1, after a current flows through the outer peripheral coils 81, an electron density distribution 401 when the current flows through the middle coil 83 and an electron density distribution 402 when no current flows through the middle coil 83 are calculated. It is understood that the electron density distribution 401 can be locally increased at a position of 411 at a position around the radius of 100 mm indicated by the radial position 310 corresponding to ON/OFF of the middle coil 83.

When the sample 3 is a wafer having a diameter of Φ300 mm, it is desirable that a center position of the middle yoke 84 in a radial direction is disposed at R=50 to 100 [mm]. More desirably, when a wavelength of radio frequency power is λ and a relative permittivity of the shower plate 5 is s, $R=\lambda/\varepsilon/4*1000$ [mm]. This is because a standing wave is likely to be generated at half an effective wavelength of a radio frequency propagating in a dielectric.

As described above, in the present embodiment, the outer peripheral yoke 82 having the L-shaped cross section is disposed above the plasma generation region to generate a path where the magnetic flux returns from a center to an outer peripheral side, the U-shaped middle yoke 84 which opens downward is disposed right above a middle region of the wafer, and the middle coil 83 is disposed therein. In order to return the magnetic flux emitted from the in-side end portion 8201 of the outer peripheral yoke 82 to the out-side end portion 8202 of the outer peripheral yoke 82 via the middle yoke 84 and return the magnetic flux emitted from the end portions 8401 of the middle yoke 84 to the middle yoke 84, the outer peripheral yoke 82 is disposed above the middle yoke 84 and on an outer periphery of the middle yoke 84.

Accordingly, in the plasma processing apparatus 100 according to the present embodiment, by controlling the current applied to the outer peripheral coils 81 using the controller 70, in the generation region of the plasma 11 above the sample 3 placed on the sample stage 2 inside the vacuum vessel 10, the variable divergent magnetic field is formed such that the magnetic flux density (Br) in the radial direction of the sample 3 becomes larger toward the outer periphery, and by controlling the current applied to the middle coil 83 using the control device 70, the Br in the middle region (R=50 to 100 [mm]) in the generation region of the plasma 11 above the sample 3 can be variable.

By disposing the outer peripheral coils 81, the middle coil 83, the outer peripheral yoke 82, and the middle yoke 84 as shown in FIG. 1 of the present embodiment, the magnetic field formed by the outer peripheral yoke 82 having the L-shaped cross section and the middle yoke 84 having the U-shaped cross section forms the magnetic flux that diverges smoothly from the center toward the outer periphery, and the unevenness of the plasma density distribution can be controlled. Further, the U-shaped middle yoke 84 forms the magnetic flux loop relatively independent of the L-shaped outer peripheral yoke 82, and as shown in FIG. 4, the plasma density distribution in the middle region can be controlled.

As described above, according to the present embodiment, the plasma density distribution can be independently controlled both in a distribution with high center and a nodal distribution, and the processing uniformity can be ensured with higher accuracy when a plasma processing is performed on a sample placed on a sample stage.

Further, according to the present embodiment, the plasma density in a middle peripheral region (R=50 to 100 mm) of a wafer of Φ300 mm can be independently controlled while concentrically controlling the overall plasma density unevenly, and the processing uniformity can be ensured with higher accuracy when the plasma processing is performed on the wafer of Φ300 mm.

[First Modification]

A first modification of the embodiment of the invention will be described with reference to FIG. 5. FIG. 5 shows a configuration of the L-shaped outer peripheral yoke 82, the U-shaped middle yoke 84, and portions corresponding to the periphery thereof in the plasma processing apparatus 100 described in FIG. 1.

The configuration in FIG. 5 differs from the configuration shown in FIG. 1 in that the L-shaped outer peripheral yoke 82 of FIG. 1 is replaced with an L-shaped outer peripheral yoke 821. The difference is that in the L-shaped outer peripheral yoke 82 of FIG. 1, the in-side end portion 8201 overlaps the U-shaped middle yoke 84, whereas in the configuration of the present modification shown in FIG. 5, an in-side end portion 8211 of the L-shaped outer peripheral yoke 821 does not overlap the U-shaped middle yoke 84. That is, a diameter of the in-side end portion 8211 of the L-shaped outer peripheral yoke 821 is larger than an outer diameter of the U-shaped middle yoke 84, and the inner-side end portion 8211 of the L-shaped outer peripheral yoke 821 is disposed in the vicinity of the U-shaped middle yoke 84.

Even when the L-shaped outer peripheral yoke 821 and the U-shaped middle yoke 84 are in a relationship shown in FIG. 5, due to the magnetic field generated by flowing the current through the outer peripheral coils 81, the magnetic flux emitted from the in-side end portion 8211 of the outer peripheral yoke 821 can be returned to an out-side end portion 8212 of the outer peripheral yoke 821 via the middle yoke 84. Further, due to the magnetic field generated by flowing the current through the middle coil 83, the magnetic flux emitted from the end portions 8401 of the middle yoke 84 can be returned to the middle yoke 84 via the outer peripheral yoke 821.

Accordingly, a magnetic field formed by the L-shaped outer peripheral yoke 821 and the U-shaped middle yoke 84 forms a magnetic flux that diverges smoothly from the center toward the outer periphery, and the unevenness of the plasma distribution can be controlled. Further, the U-shaped middle yoke 84 forms a magnetic flux loop relatively independent of the L-shaped outer peripheral yoke 821, and as shown in FIG. 4, the plasma density distribution in the middle region can be controlled.

With a coil and yoke arrangement as in the present modification, a magnetic field formed by an L-shaped yoke and a U-shaped yoke forms a magnetic flux that diverges smoothly from the center toward the outer periphery, and the unevenness of the plasma density distribution can be controlled. Further, the U-shaped yoke forms a magnetic flux loop relatively independent of the L-shaped yoke, and the plasma density distribution in the middle region can be controlled.

As a result, the magnetic field can be controlled relatively accurately in the generation region of the plasma above the sample stage 2, the electron density distribution in the vicinity of the sample 3 placed on the sample stage 2 can be controlled relatively accurately, and the processing uniformity can be ensured with higher accuracy when the plasma processing is performed on the sample 3 placed on the sample stage 2.

Further, according to the present modification, the plasma density in the middle peripheral region (R=50 to 100 mm) of the wafer of Φ300 mm can be independently controlled while concentrically controlling the overall plasma density unevenly, and the processing uniformity can be ensured with higher accuracy when the plasma processing is performed on the wafer of Φ300 mm.

[Second Modification]

A second modification of the embodiment of the invention will be described with reference to FIG. 6. FIG. 6 shows a configuration of the L-shaped outer peripheral yoke 82, the U-shaped middle yoke 84, and portions corresponding to the periphery thereof in the plasma processing apparatus 100 described in FIG. 1.

The configuration of FIG. 6 differs from the configuration shown in FIG. 1 in that the L-shaped outer peripheral yoke 82 of FIG. 1 is replaced with the L-shaped outer peripheral yoke 821 as in the case of the first modification and the middle yoke 84 is replaced with a U-shaped middle yoke 841.

In the L-shaped outer peripheral yoke 821 of FIG. 1, the in-side end portion 8201 overlaps the U-shaped middle yoke 84, whereas in the configuration of the present modification shown in FIG. 6, the in-side end portion 8211 of the L-shaped outer peripheral yoke 821 does not overlap the U-shaped middle yoke 841 as in the case of the first modification.

Further, a position of the middle coil 83 in a height direction is substantially equal to a height of the outer peripheral coil 81 in the vicinity of the in-side end portion 8211 of the outer peripheral yoke 821, and end portions 8411 of the U-shaped middle yoke 841 have long protruding shapes such that positions of the end portions 8411 of the U-shaped middle yoke 841 are the same as positions of the end portions 8401 of the U-shaped middle yoke 84 in the embodiment described in FIG. 1.

Even when the L-shaped outer peripheral yoke 821 and the U-shaped middle yoke 841 are in a relationship shown in FIG. 6, due to the magnetic field generated by flowing the current through the outer peripheral coils 81, the magnetic flux emitted from the in-side end portion 8211 of the outer peripheral yoke 821 can be returned to the out-side end portion 8212 of the outer peripheral yoke 821 via the middle yoke 841. Further, due to the magnetic field generated by flowing the current through the middle coil 83, the magnetic flux emitted from the end portions 8411 of the middle yoke 841 can be returned to the middle yoke 841 via the outer peripheral yoke 821.

Accordingly, a magnetic field formed by the L-shaped outer peripheral yoke 821 and the U-shaped middle yoke 841 forms a magnetic flux that diverges smoothly from the center toward the outer periphery, and the unevenness of the plasma density distribution can be controlled. Further, the U-shaped middle yoke 841 forms a magnetic flux loop relatively independent of the L-shaped outer peripheral yoke 821, and as shown in FIG. 4, the plasma density distribution in the middle region can be controlled.

According to the present modification, with a coil and yoke arrangement as shown in FIG. 6, a magnetic field formed by an L-shaped yoke and a U-shaped yoke forms a magnetic flux that diverges smoothly from the center toward the outer periphery, and the unevenness of the plasma density distribution can be controlled. Further, the U-shaped yoke forms a magnetic flux loop relatively independent of the L-shaped yoke, and the plasma density distribution in the middle region can be controlled.

As a result, the magnetic field can be controlled relatively accurately in the generation region of the plasma 11 above the sample stage 2, the plasma density distribution in the vicinity of the sample 3 placed on the sample stage can be controlled relatively accurately, and the processing uniformity can be ensured with higher accuracy when the plasma processing is performed on the sample 3 placed on the sample stage 2.

Further, according to the present modification, the plasma density in the middle peripheral region (R=50 to 100 mm) of the wafer of Φ300 mm can be independently controlled while concentrically controlling overall the plasma density unevenly, and the processing uniformity can be ensured with higher accuracy when the plasma processing is performed on the wafer of Φ300 mm.

[Third Modification]

A third modification of the embodiment of the invention will be described with reference to FIG. 7. FIG. 7 shows a configuration of the L-shaped outer peripheral yoke 82, the U-shaped middle yoke 84, and portions corresponding to the periphery thereof in the plasma processing apparatus 100 described in FIG. 1.

The configuration in FIG. 7 differs from the configuration shown in FIG. 1 in that the L-shaped outer peripheral yoke 82 of FIG. 1 is replaced with an L-shaped outer peripheral yoke 822. The difference is that in the L-shaped outer peripheral yoke 82 of FIG. 1, the in-side end portion 8201 partially overlaps the U-shaped middle yoke 84, whereas in the configuration of the present modification shown in FIG. 7, an in-side end portion 8221 of the L-shaped outer peripheral yoke 822 overlaps a U-shaped middle yoke 842 so as to cover the entire U-shaped middle yoke 842.

Because the L-shaped outer peripheral yoke 822 and the U-shaped middle yoke 842 are in a relationship shown in FIG. 7, due to the magnetic field generated by flowing the current through the outer peripheral coils 81, the magnetic flux emitted from the in-side end portion 8221 of the outer peripheral yoke 822 can be returned to an out-side end portion 8222 of the outer peripheral yoke 822 via the middle yoke 842. Further, due to the magnetic field generated by flowing the current through the middle coil 83, the magnetic flux emitted from end portions 8421 of the middle yoke 842 can be returned to the middle yoke 842 via the outer peripheral yoke 822.

According to the present modification, with a coil and yoke arrangement as shown in FIG. 7, a magnetic field formed by the L-shaped outer peripheral yoke 822 and the U-shaped middle yoke 842 forms a magnetic flux that diverges smoothly from the center toward the outer periphery, and the unevenness of the plasma density distribution can be controlled. Further, the U-shaped middle yoke 842 forms a relatively independent magnetic flux loop with respect to the L-shaped outer peripheral yoke 822, and as shown in FIG. 4, the plasma density distribution in the middle region can be controlled.

As a result, the magnetic field can be controlled relatively accurately in the generation region of the plasma above the sample stage 2, the electron density distribution in the vicinity of the sample 3 placed on the sample stage 2 can be controlled relatively accurately, and the processing uniformity can be ensured with higher accuracy when the plasma processing is performed on the sample 3 placed on the sample stage 2.

Further, according to the present modification, the plasma density in the middle peripheral region (R=50 to 100 mm) of the wafer of Φ300 mm can be independently controlled while concentrically controlling overall the plasma density unevenly, and the processing uniformity can be ensured with higher accuracy when the plasma processing is performed on the wafer of Φ300 mm.

[Fourth Modification]

As a fourth modification of the embodiment of the invention, FIG. 8 shows a modification of a combination of the middle coil 83 and the U-shaped middle yoke 84 in the plasma processing apparatus 100 described in FIG. 1. In this case, since the outer peripheral coils 81 and the outer peripheral yoke 82 have the same configuration as those in the embodiment described in FIG. 1, the description will be omitted.

In the present modification shown in FIG. 8, the middle coil 83 described in the first embodiment is separated into two, and is constituted by a first middle coil 831 and a second middle coil 832, which are formed so as to be covered by a U-shaped middle yoke 843.

As an outer peripheral yoke, in addition to the outer peripheral yoke 82 described in the first embodiment, the outer peripheral yoke 822 described in the first modification or the outer peripheral yoke 822 described in the third modification may be used.

By constituting the middle coil 83 described in the first embodiment using the first middle coil 831 and the second middle coil 832, a magnetic field in the generation region of the plasma 11 above the sample stage 2 can be more finely controlled and a radial position where the electron density of the plasma increases can be adjusted depending on a middle coil in which the current flows.

As a result, the magnetic field can be controlled relatively accurately in the generation region of the plasma above the sample stage 2, the electron density distribution in the vicinity of the sample 3 placed on the sample stage 2 can be controlled relatively accurately, and the processing uniformity can be ensured with higher accuracy when the plasma processing is performed on the sample 3 placed on the sample stage 2.

Although a configuration shown in FIG. 8 includes the first middle coil 831 and the second middle coil 832, the number of middle coils may be three or more.

Further, according to the present modification, the plasma density in the middle peripheral region (R=50 to 100 mm) of the wafer of Φ300 mm can be independently controlled while concentrically controlling the overall plasma density unevenly, and the processing uniformity can be ensured with higher accuracy when the plasma processing is performed on the wafer of Φ300 mm.

[Fifth Modification]

As a fifth modification of the embodiment of the invention, FIG. 9 shows a modification of a combination of the middle coil 83 and the U-shaped middle yoke 84 in the plasma processing apparatus 100 described in FIG. 1. In this case, since the outer peripheral coils 81 and the outer peripheral yoke 82 have the same configuration as those in the embodiment described in FIG. 1, the description will be omitted.

In the present modification shown in FIG. 9, the middle coil 83 and the U-shaped middle yoke 84 described in the first embodiment have two combinations, and include a combination of a first middle coil 833 and a first U-shaped middle yoke 844 and a combination of a second middle coil 834 and a second U-shaped middle yoke 845.

As an outer peripheral yoke, in addition to the outer peripheral yoke 82 described in the first embodiment, the outer peripheral yoke 822 described in the first modification or the outer peripheral yoke 822 described in the third modification may be used.

As described above, by constituting the combination of the first middle coil 833 and the first U-shaped middle yoke 844 and the combination of the second middle coil 834 and the second U-shaped middle yoke 845, the magnetic field in the generation region of the plasma 11 above the sample stage 2 can be more finely controlled and the radial position where the electron density of the plasma increases can be more finely adjusted depending on a middle coil in which the current flows.

As a result, the magnetic field can be controlled relatively finely in the generation region of the plasma 11 above the sample stage 2, the electron density distribution in the vicinity of the sample 3 placed on the sample stage can be more finely controlled, and the processing uniformity can be ensured with higher accuracy when the plasma processing is performed on the sample 3 placed on the sample stage 2.

Although a configuration shown in FIG. 9 shows a case where the number of the combination of the middle coil and the middle yoke is two, the number of combinations of the middle coil and the middle yoke may be three or more.

Further, according to the present modification, the plasma density in the middle peripheral region (R=50 to 100 mm) of the wafer of Φ300 mm can be independently controlled while concentrically controlling the overall plasma density unevenly, and the processing uniformity can be ensured with higher accuracy when the plasma processing is performed on the wafer of Φ300 mm.

INDUSTRIAL APPLICABILITY

The invention can be used in, for example, an etching apparatus for forming a fine pattern on a semiconductor wafer by etching the semiconductor wafer with plasma in a manufacturing line of a semiconductor device.

REFERENCE SIGN LIST

2: sample stage
2*a*: base member
3: sample
4: upper electrode
5: shower plate
8: radio frequency power source for discharge
10: vacuum vessel
11: plasma
12: upper electrode insulator
13: insulation ring
22: insulation plate
23: insulation layer
24: shield plate
25: susceptor ring
40: processing chamber
45: evacuation unit

50: plasma forming unit
51: through holes
70: control device
81: outer peripheral coil
82, 821, 822: outer peripheral yoke
83, 831, 832, 833, 834: middle coil
84, 841, 842, 843, 844, 845: middle yoke
100: plasma processing apparatus

The invention claimed is:

1. A plasma processing apparatus comprising:
a vacuum vessel in which a plasma processing is performed on a sample;
a radio frequency power source configured to supply radio frequency power for generating plasma;
a sample stage on which the sample is placed; and
a plurality of outer peripheral coils configured to form a magnetic field inside the vacuum vessel and disposed outside the vacuum vessel and comprising a first outer coil extending in a horizontal direction and a second outer coil extending in a vertical direction;
a middle coil disposed in the horizontal direction and positioned inwardly from the first outer coil and having a diameter smaller than a diameter of the first outer coil;
a first yoke having a first portion extending in the horizontal direction that covers the first outer coil and an upper side surface of the vacuum vessel, and a second portion extending in the vertical direction that covers the second outer coil; and
a second yoke having three side portions and arranged in a U-shape to cover a top portion and two sides of the middle coil and has an opening below the second middle coil,
wherein the middle coil and the second yoke each have a portion extending in the horizontal direction that are not covered by the first yoke.

2. The plasma processing apparatus according to claim 1, wherein
the first yoke is disposed at a position that does not make electrical contact with the second yoke.

3. The plasma processing apparatus according to claim 1, wherein
the second yoke is partially disposed inside the first yoke.

4. The plasma processing apparatus according to claim 1, wherein
an outer side portion of the second yoke in a plan view is equal to or larger than a diameter of the sample in the plan view.

5. The plasma processing apparatus according to claim 1, wherein
the middle coil has a first middle coil and a second middle coil.

6. The plasma processing apparatus according to claim 5, wherein
the second yoke has a first sub-yoke covering the first middle coil and a second sub-yoke covering the second middle coil.

7. The plasma processing apparatus according to claim 1, further comprising:
a controller configured to control a current flowing through the second outer coil such that a divergent magnetic field in which magnetic flux density in a radial direction of the sample increases toward an outer periphery of the sample is formed, and control a current flowing through the middle coil such that magnetic flux density in a middle region of the sample in the radial direction becomes a desired value.

8. The plasma processing apparatus according to claim 1, wherein
the middle coil and the second yoke are configured to cause magnetic force lines to be emitted from a first end of the first yoke and to return to a second end of the first yoke via the middle yoke, and to cause magnetic force lines to be emitted from the second yoke and to return to the second yoke.

9. A plasma processing apparatus comprising:
a vacuum vessel in which a plasma processing is performed on a sample;
a radio frequency power source configured to supply radio frequency power for generating plasma;
a sample stage on which the sample is placed;
a plurality of outer coils configured to form a magnetic field inside the vacuum vessel and disposed outside the vacuum vessel and comprising
a first outer coil extending in a first direction; and
a second outer coil extending in a second direction;
an inner coil extending in the first direction;
a first yoke that covers the plurality of outer coils and an upper side and a side surface of the vacuum vessel, and in which the plurality of outer coils are disposed, and having an inner end with an opening in the first direction and an outer end with an opening in the second direction; and
a second yoke that covers the inner coil and having a plurality of end portions each having an opening in the second direction,
wherein the plurality of outer coils, the inner coil, the first yoke, and the second yoke are configured to cause magnetic force lines to be emitted from the opening of the inner end of the first yoke in the first direction onto an upper surface of the second yoke, and to return to the opening of the outer end in the second direction of the first yoke via said plurality of end portions of the second yoke, and to cause magnetic force lines to be emitted from said plurality of end portions of the second yoke to the opening of the outer end in the second direction of the first yoke, and to return to the upper surface of the second yoke via the opening of the inner end of the first yoke,
wherein the inner coil and the second yoke each have a portion extending in the horizontal direction that are not covered by the first yoke.

* * * * *